(12) United States Patent
Ha

(10) Patent No.: US 9,454,073 B2
(45) Date of Patent: Sep. 27, 2016

(54) PHOTOMASK BLANK AND PHOTOMASK FOR SUPPRESSING HEAT ABSORPTION

(71) Applicant: SK hynix Inc., Icheon (KR)

(72) Inventor: Tae Joong Ha, Daejeon (KR)

(73) Assignee: SK HYNIX INC., Icheon (KR)

( * ) Notice: Subject to any disclaimer, the term of this patent is extended or adjusted under 35 U.S.C. 154(b) by 97 days.

(21) Appl. No.: 14/550,847

(22) Filed: Nov. 21, 2014

(65) Prior Publication Data

US 2015/0227040 A1    Aug. 13, 2015

(30) Foreign Application Priority Data

Feb. 10, 2014  (KR) .................. 10-2014-0014898
Jun. 16, 2014  (KR) .................. 10-2014-0073127

(51) Int. Cl.
*G03F 1/38* (2012.01)
*G03F 1/52* (2012.01)

(52) U.S. Cl.
CPC .. *G03F 1/38* (2013.01); *G03F 1/52* (2013.01)

(58) Field of Classification Search
CPC .................................. G03F 1/38; G03F 1/52
See application file for complete search history.

(56) References Cited

U.S. PATENT DOCUMENTS

2007/0020534 A1*  1/2007  Yoshikawa ............... G03F 1/32
                                                430/5
2010/0176087 A1*  7/2010  Igarashi ................... G03F 1/14
                                                216/79
2011/0117479 A1*  5/2011  Suga ...................... B82Y 10/00
                                                430/5

FOREIGN PATENT DOCUMENTS

| KR | 10-2008-0008877 A | 1/2008 |
| KR | 10-2008-0077870 A | 8/2008 |
| KR | 10-2010-0081831 A | 7/2010 |
| KR | 10-2011-0031558 A | 3/2011 |

* cited by examiner

*Primary Examiner* — Stephen Rosasco

(57) ABSTRACT

A photomask blank and/or photomask includes a light transmitting substrate, a highly reflective material layer disposed on the light transmitting substrate, and a transfer pattern layer disposed on the highly reflective material layer. The highly reflective material layer reflects light to be transmitted through the light transmitting substrate, with a predetermined reflectivity.

23 Claims, 10 Drawing Sheets

PHOTOMASK BLANK AND PHOTOMASK FOR SUPPRESSING HEAT ABSORPTION

CROSS-REFERENCE TO RELATED APPLICATIONS

The present application claims priority under 35 U.S.C. 119(a) to Korean Patent Application Nos. 10-2014-0014898 and 10-2014-0073127, filed on Feb. 10, 2014 and Jun. 16, 2014, respectively, in the Korean Intellectual Property Office, which are incorporated herein by references in their entireties.

BACKGROUND

1. Technical Field

Embodiments of the present disclosure relate to a photomask, and more particularly, to a photomask blank and/or a photomask capable of suppressing heat absorption during a photolithography process.

2. Related Art

In general, a semiconductor device has a structure in which patterns are disposed on a semiconductor substrate. The patterns, provided as active or passive elements on the semiconductor substrate, are formed through a photolithography process and an etching process. Using a photolithography process to form photoresist layer patterns involves forming a photoresist layer on a target layer to be formed with the patterns, and then performing an exposure process using a photomask and a development process using a developer. The photoresist layer patterns may be used as an etch mask layer for patterning the target layer. The photomask used for transferring the patterns to a wafer generally has a structure in which transfer patterns to be transferred are disposed on a light transmitting substrate.

SUMMARY

Various embodiments are directed to a photomask blank (also referred to herein as "blank mask") and a photomask for suppressing heat absorption.

In an embodiment, a blank mask may include: a light transmitting substrate; a highly reflective material layer disposed on the light transmitting substrate; and a light shielding layer disposed on the highly reflective material layer.

In an embodiment, a blank mask may include: a light transmitting substrate; and a light shielding layer disposed on the light transmitting substrate, and formed of a material which reflects 20% to 90% of light irradiated.

In an embodiment, a photomask may include: a light transmitting substrate; a highly reflective material layer pattern disposed on the light transmitting substrate to expose a light transmitting region of the light transmitting substrate; and a light shielding layer pattern disposed on the highly reflective material layer pattern.

In an embodiment, a photomask may include: a light transmitting substrate; and a light shielding layer pattern disposed on the light transmitting substrate to be transferred to a wafer by a photolithography process, and formed of a material which reflects 20% to 90% of a quantity of light irradiated through the light transmitting substrate.

In an embodiment, a photomask may include: a light transmitting substrate; and a light shielding layer pattern disposed on the light transmitting substrate, and including a first light shielding layer pattern which is relatively thick and a second light shielding layer pattern which is relatively thin, wherein both the first light shielding layer pattern and the second light shielding layer pattern are transferred to a wafer by a photolithography process.

In an embodiment, a photomask may include: a light transmitting substrate; and a light shielding layer pattern disposed on the light transmitting substrate, and having therein trench segments which expose the light transmitting substrate.

DETAILED DESCRIPTION

A photomask blank (also referred to herein as "blank mask") and a photomask for suppressing heat absorption is described herein through various embodiments with reference to the accompanying drawings.

In the course of a photolithography process, light of a specified wavelength is irradiated through a photomask to a photoresist layer on a wafer. Light irradiation to the wafer is substantially shielded by a light shielding region of the photomask, such as a region where a light shielding pattern is disposed, and only the light transmitted through a light transmitting region is selectively irradiated to the wafer. Thus, a substantial quantity of irradiated light energy is absorbed by the light shielding pattern, which may cause heat to be generated at or in the light shielding pattern. The generated heat is transferred to a light transmitting substrate, and the light transmitting substrate expands due to a rise in temperature. Due to the expansion of the light transmitting substrate, errors may occur in the positional precision of the pattern of the photomask, and as a consequence, the overlay between the wafer and the photomask may not be precisely secured. Various embodiments disclosed herein provide blank masks and photomasks capable of suppressing the occurrence of a phenomenon that the light irradiated during a photolithography process is absorbed into a transfer pattern. As the absorption of light energy into the transfer pattern is suppressed, a rise in temperature of the transfer pattern and a light transmitting substrate may be suppressed during the photolithography process.

In the present specification, terms such as "first" and "second" are used to distinguish members from each other, and do not limit the members or indicate a specific order. Moreover, when a member is referred to as being "on" another member or being on the "top", "bottom" or "side" of another member, it indicates a relative positional relationship therebetween, and does not specify the case in which the member directly contacts another member or still another member is further interposed at the interface therebetween. Furthermore, when a component element is referred to as being "coupled" or "connected" to another component element, it indicates that the component element may be directly coupled or connected to another component element or additional component elements may be interposed therebetween to form a coupling relationship or a connection relationship.

Figure 1:
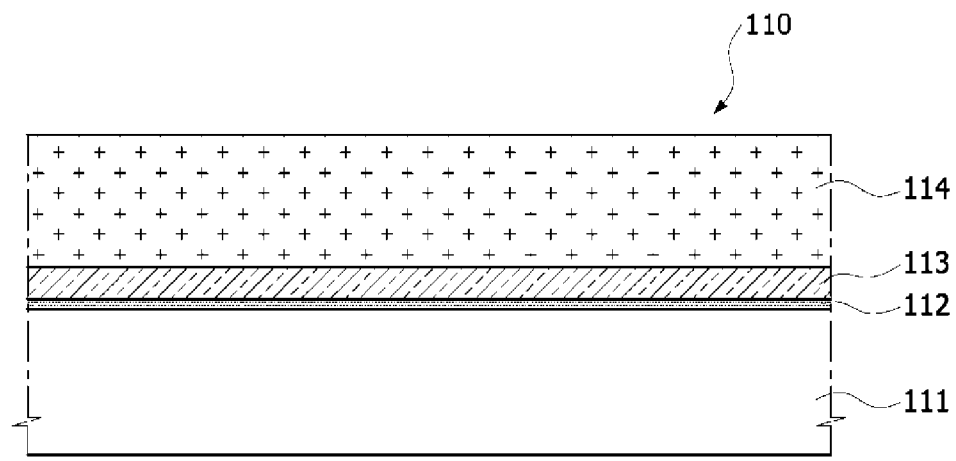
FIG. 1 is a cross-sectional view illustrating a blank mask in accordance with an embodiment.

FIG. 1 is a cross-sectional view illustrating a blank mask in accordance with an embodiment. Referring to FIG. 1, a blank mask 110 in accordance with the present embodiment has a structure in which a highly reflective material layer 112, a light shielding layer 113 and a photoresist layer 114 are stacked and/or disposed on a light transmitting substrate 111. In another embodiment, the photoresist layer 114 may be omitted. The light transmitting substrate 111 may be formed of a material that transmits light, for example, quartz. The highly reflective material layer 112 may be formed of a material that includes at least any one of silicon (Si), molybdenum (Mo), tantalum (Ta), zirconium (Zr), aluminum (Al), titanium (Ti), platinum (Pt), ruthenium (Ru), chrome (Cr) and stannum (Sn). Also, the highly reflective material layer 112 may additionally include any one constituent of oxygen (O) and nitrogen (N). Such a highly reflective material layer 112 may have a reflectivity of 20% to 90% with respect to light. The reflectivity of the highly reflective material layer 112 may be appropriately controlled by regulating the composition ratio of materials that form the highly reflective material layer 112. In an embodiment, the highly reflective material layer 112 may have a thickness smaller than the thickness of the light shielding layer 113. In another embodiment, the highly reflective material layer 112 may have a thickness equal to or larger than the light shielding layer 113 The light shielding layer 113 may be formed of a light shielding material layer, for example, a chrome (Cr) layer.

Figure 2:
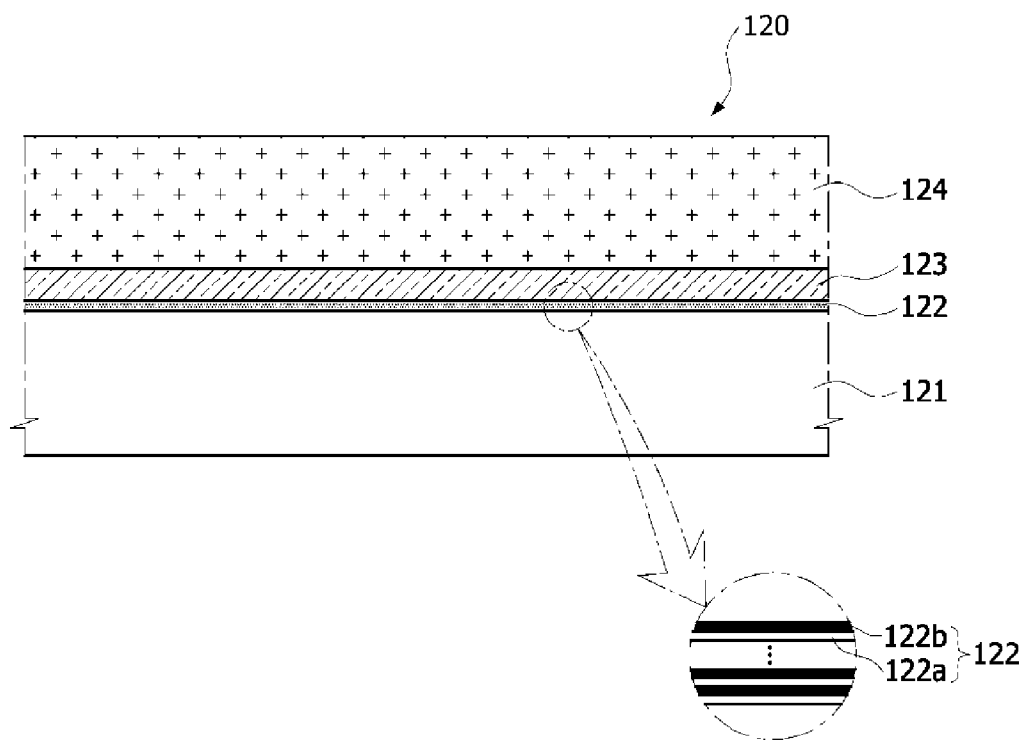
FIG. 2 is a cross-sectional view illustrating a blank mask in accordance with an embodiment.

FIG. 2 is a cross-sectional view illustrating a blank mask in accordance with an embodiment. Referring to FIG. 2, a blank mask 120 in accordance with the present embodiment has a structure in which a highly reflective material layer 122, a light shielding layer 123 and a photoresist layer 124 are stacked and/or disposed on a light transmitting substrate 121. In another embodiment, the photoresist layer 124 may be omitted.

The light transmitting substrate 121 may be formed of a material that transmits light, for example, quartz. The highly reflective material layer 122 may have a multi-layered structure. In the present embodiment, the highly reflective material layer 122 may have a structure in which a first layer 122a and a second layer 122b are alternately disposed. In an embodiment, the first layer 122a and the second layer 122b may be, respectively, a molybdenum (Mo) layer and a silicon (Si) layer. In another embodiment, the first layer 122a and the second layer 122b may be, respectively, a ruthenium (Ru) layer and a silicon (Si) layer, a molybdenum (Mo) layer and a beryllium (Be) layer, or a silicon (Si) layer and a niobium (Nb) layer.

The highly reflective material layer 122 may have a reflectivity of 20% to 90% with respect to light. The reflectivity of the highly reflective material layer 122 may be appropriately controlled by regulating the thicknesses and the number of stacked highly reflective material layers 122 that include the first layer 122a and the second layer 122b. In an embodiment, the highly reflective material layer 122 may have a thickness smaller than the thickness of the light shielding layer 123. In another embodiment, the highly reflective material layer 122 may have a thickness equal to or larger than the light shielding layer 123. The light shielding layer 123 may be formed of a light shielding material layer, for example, a chrome (Cr) layer.

Figure 3:
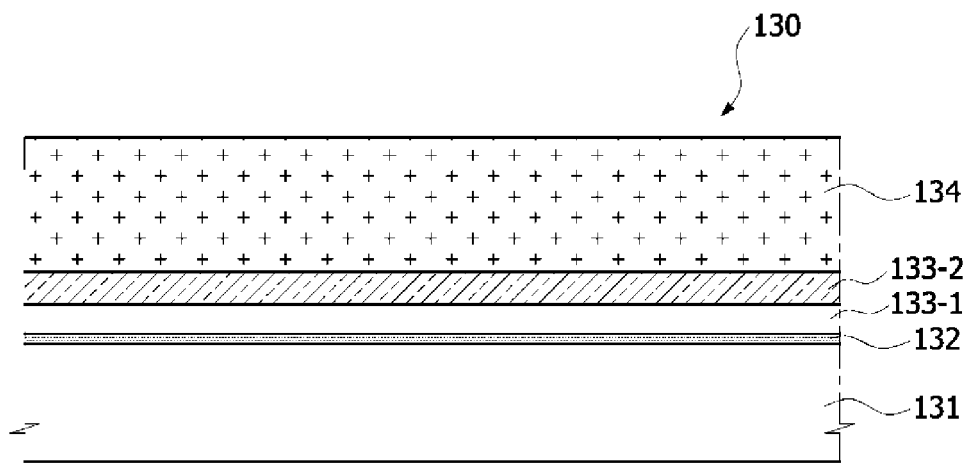
FIG. 3 is a cross-sectional view illustrating a blank mask in accordance with an embodiment.

FIG. 3 is a cross-sectional view illustrating a blank mask in accordance with an embodiment. Referring to FIG. 3, a blank mask 130 in accordance with the present embodiment has a structure in which a highly reflective material layer 132, a phase shifting layer 133-1, a light shielding layer 133-2 and a photoresist layer 134 are stacked and/or disposed on a light transmitting substrate 131. In another embodiment, the photoresist layer 134 may be omitted.

The light transmitting substrate 131 may be formed of a material that transmits light, for example, quartz. The highly reflective material layer 132 may be formed of a material that includes at least any one of silicon (Si), molybdenum (Mo), tantalum (Ta), zirconium (Zr), aluminum (Al), titanium (Ti), platinum (Pt), ruthenium (Ru), chrome (Cr) and stannum (Sn). Also, the highly reflective material layer 132 may additionally include any one constituent of oxygen (O) and nitrogen (N).

Such a highly reflective material layer 132 may have a reflectivity of 20% to 90% with respect to light. The reflectivity of the highly reflective material layer 132 may be appropriately controlled by regulating the composition ratio of materials that form the highly reflective material layer 132. In an embodiment, the highly reflective material layer 132 may have a thickness smaller than the thickness of the phase shifting layer 133-1. In another embodiment, the highly reflective material layer 132 may have a thickness equal to or larger than the phase shifting layer 133-1. In an embodiment, the phase shifting layer 133-1 may be formed of a phase shifting material, such as molybdenum-silicon (MoSi). In another embodiment, the phase shifting layer 133-1 may be formed of a molybdenum silicon nitride (MoSiN) or a silicon oxide (SiO2).

The stack structure of the highly reflective material layer 132 and the phase shifting layer 133-1 may have transmittance equal to or less than 50%, for example, of approximately 6%, and a phase shifting degree of 150° to 250°. The light shielding layer 133-2 may be formed of a light shielding material, such as chrome (Cr).

Figure 4:
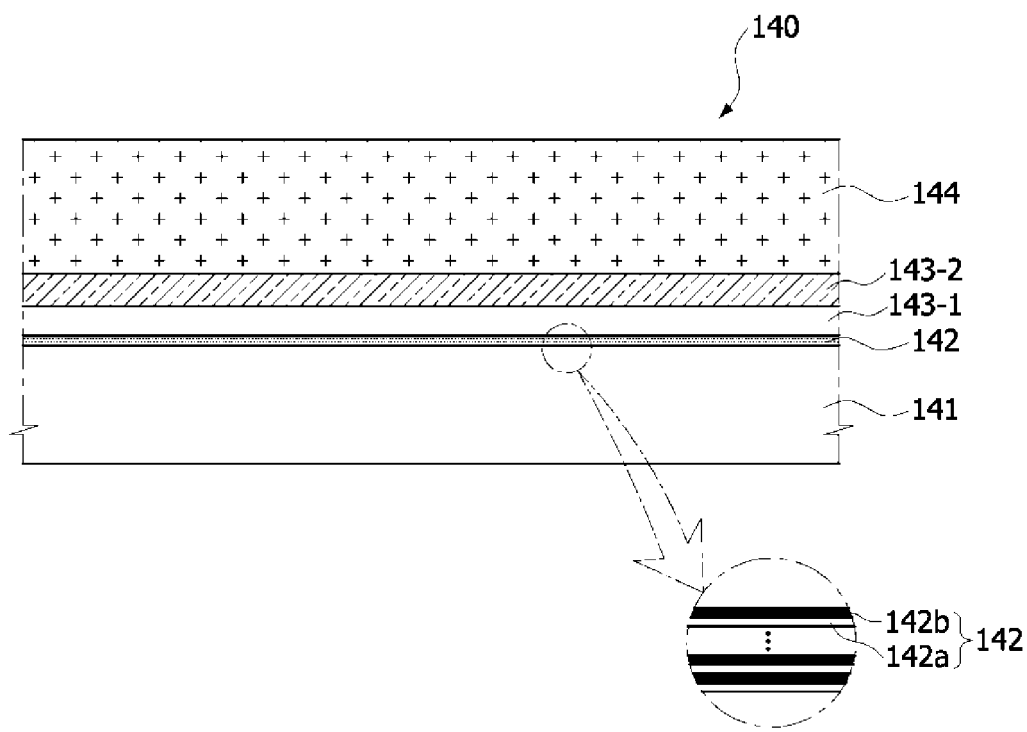
FIG. 4 is a cross-sectional view illustrating a blank mask in accordance with an embodiment.

FIG. 4 is a cross-sectional view illustrating a blank mask in accordance with an embodiment. Referring to FIG. 4, a blank mask 140 in accordance with the present embodiment has a structure in which a highly reflective material layer 142, a phase shifting layer 143-1, a light shielding layer 143-2 and a photoresist layer 144 are stacked and/or disposed on a light transmitting substrate 141. In another embodiment, the photoresist layer 144 may be omitted. The light transmitting substrate 141 may be formed of a material that transmits light, for example, quartz.

The highly reflective material layer 142 may have a multi-layered structure. In the present embodiment, the highly reflective material layer 142 may have a structure in which a first layer 142a and a second layer 142b are alternately disposed. In an embodiment, the first layer 142a and the second layer 142b may be, respectively, a molybdenum (Mo) layer and a silicon (Si) layer. In another embodiment, the first layer 142a and the second layer 142b may be, respectively, a ruthenium (Ru) layer and a silicon (Si) layer, a molybdenum (Mo) layer and a beryllium (Be) layer, or a silicon (Si) layer and a niobium (Nb) layer.

Such a highly reflective material layer 142 may have a reflectivity of 20% to 90% with respect to light. The reflectivity of the highly reflective material layer 142 may be appropriately controlled by regulating the thicknesses and the number of stacked highly reflective material layers 142 that include the first layer 142a and the second layer 142b, which form the highly reflective material layer 142. In an embodiment, the highly reflective material layer 142 may have a thickness smaller than the thickness of the phase shifting layer 143-1. In another embodiment, the highly reflective material layer 142 may have a thickness equal to or larger than the phase shifting layer 143-1.

In an embodiment, the phase shifting layer 143-1 may be formed of a phase shifting material, such as molybdenum-silicon (MoSi). In another embodiment, the phase shifting layer 143-1 may be formed of a molybdenum silicon nitride (MoSiN) or a silicon oxide (SiO2). The stack structure of the highly reflective material layer 142 and the phase shifting layer 143-1 may have transmittance equal to or less than 50%, for example, of approximately 6%, and a phase shifting degree of 150° to 250°. The light shielding layer 143-2 may be formed of a light shielding material, such as chrome (Cr).

Figure 5:
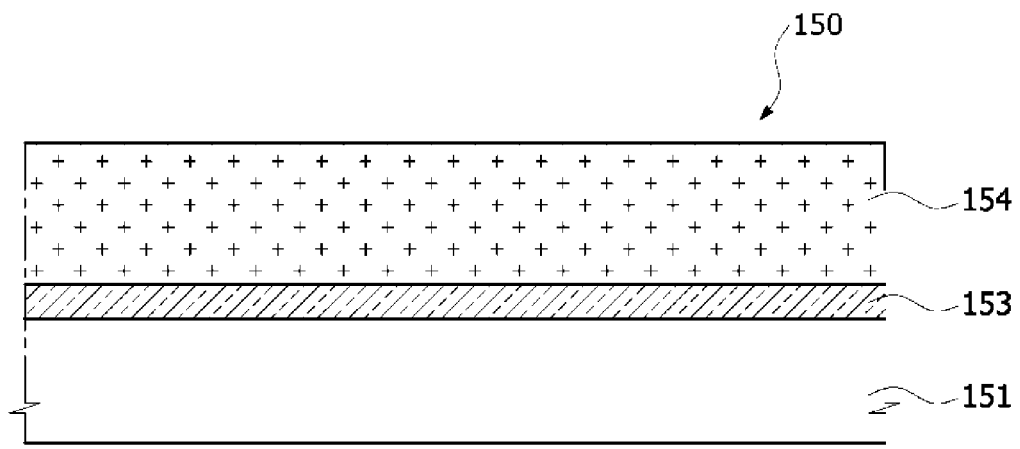
FIG. 5 is a cross-sectional view illustrating a blank mask in accordance with an embodiment.

FIG. 5 is a cross-sectional view illustrating a blank mask in accordance with an embodiment. Referring to FIG. 5, a blank mask 150 in accordance with the present embodiment has a structure in which a light shielding layer 153 and a photoresist layer 154 are stacked and/or disposed on a light transmitting substrate 151. In another embodiment, the photoresist layer 154 may be omitted. The light transmitting substrate 151 may be formed of a material that transmits light, for example, quartz. The light shielding layer 153 may be formed of a material that shields light and has a reflectivity of 20% to 90% with respect to light.

In an embodiment, the light shielding layer 153 may be a light shielding material layer, such as a chrome (Cr) layer, which is added with a reflectivity regulating constituent such as oxygen (O) and nitrogen (N). While not shown in the Figure, in an embodiment, a phase shifting layer may be additionally disposed between the light shielding layer 153 and the light transmitting substrate 151. In the embodiment, the phase shifting layer may have reflectivity of 20% to 90% with respect to light, by appropriately adding a reflectivity regulating constituent, such as oxygen (O) and nitrogen (N), to a phase shifting material such as molybdenum-silicon (MoSi).

Figure 6:
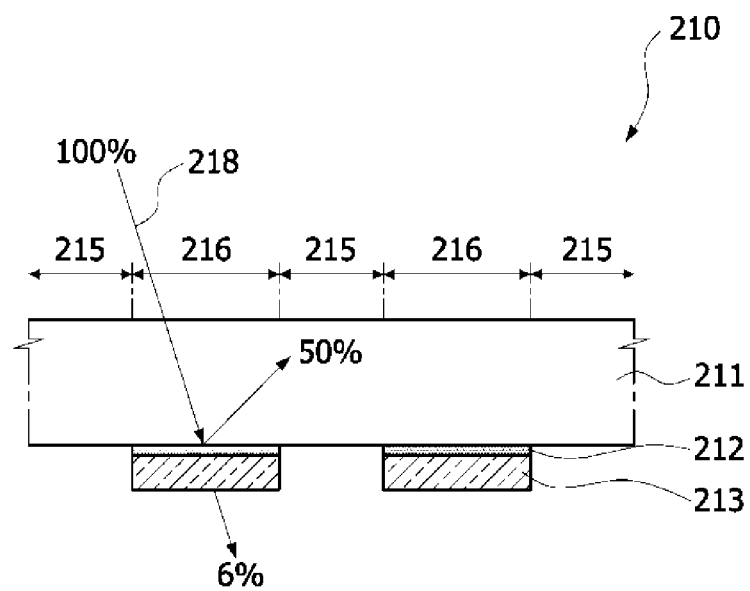
FIG. 6 is a cross-sectional view illustrating a photomask in accordance with an embodiment.

FIG. 6 is a cross-sectional view illustrating a photomask in accordance with an embodiment. Referring to FIG. 6, a photomask 210 in accordance with the present embodiment includes highly reflective material layer patterns 212 and light shielding layer patterns 213, which are disposed on a light transmitting substrate 211. Such a photomask 210 may be formed through an appropriate patterning process by using the blank mask 110 described above with reference to FIG. 1 as an original processing target.

The photomask 210 has light transmitting regions 215 and light shielding regions 216. The surface of the light transmitting substrate 211 is exposed in the light transmitting regions 215, and the highly reflective material layer patterns 212 and the light shielding layer patterns 213 are disposed on the light transmitting substrate 211 in the light shielding regions 216. The light transmitting substrate 211 may be formed of a light transmitting material, for example, quartz.

While it is illustrated in the Figure that the light shielding regions 216, in which the highly reflective material layer patterns 212 and the light shielding layer patterns 213 are disposed, serve as regions where main patterns for transferring patterns to a wafer are disposed, the light shielding regions 216 may serve as other regions, for example, frame regions which surround regions where main patterns are to be disposed and/or scribe lines.

The highly reflective material layer patterns 212 may be formed of a material that includes at least any one of silicon (Si), molybdenum (Mo), tantalum (Ta), zirconium (Zr), aluminum (Al), titanium (Ti), platinum (Pt), ruthenium (Ru), chrome (Cr) and stannum (Sn). Also, the highly reflective material layer patterns 212 may additionally include any one constituent of oxygen (O) and nitrogen (N).

Such highly reflective material layer patterns 212 may have a reflectivity of 20% to 90% with respect to light. The reflectivity of the highly reflective material layer patterns 212 may be appropriately controlled by regulating the composition ratio of materials that form the highly reflective material layer patterns 212. In an embodiment, the highly reflective material layer patterns 212 may have a thickness smaller than the thickness of the light shielding layer patterns 213. In another embodiment, the highly reflective material layer patterns 212 may have a thickness equal to or larger than the light shielding layer patterns 213. The light shielding layer patterns 213 may be formed of a light shielding material, for example, chrome (Cr) layer patterns.

In the photomask 210 in accordance with the present embodiment, light corresponding to 20% to 90% of incident light 218, which is transmitted through the light transmitting substrate 211, is reflected to the light transmitting substrate 211 by the highly reflective material layer patterns 212. Accordingly, an amount of light corresponding to 6% of the incident light 218 is transmitted through the light shielding layer patterns 213. And an amount of light corresponding to 4% to 74% of the incident light 218 is absorbed into the light shielding layer patterns 213. As shown in the Figure, in an embodiment where the highly reflective material layer patterns 212 have a reflectivity of 50% and the light shielding layer patterns 213 have a transmittance of 6%, light corresponding to 44% is absorbed into the light shielding layer patterns 213. Thus, when compared to the case where all the remaining quantity of light (except small quantities of reflected light and transmitted light) is absorbed into the light shielding layer patterns 213, a temperature rise of the light shielding layer patterns 213 may be suppressed during a photolithography process. In another embodiment, when a material with low thermal conductivity is used as the material of the highly reflective material layer patterns 212, it is possible to decrease a degree at which the heat generated by the absorption of a quantity of light by the light shielding layer patterns 213 is transferred to the light transmitting substrate 211.

Figure 7:
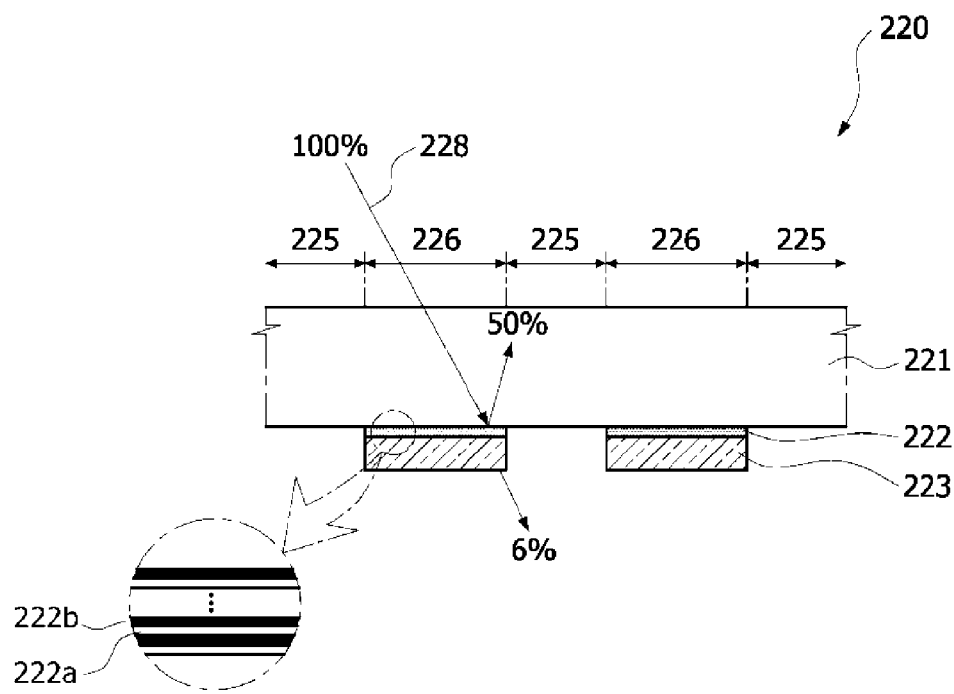
FIG. 7 is a cross-sectional view illustrating a photomask in accordance with an embodiment.

FIG. 7 is a cross-sectional view illustrating a photomask in accordance with an embodiment. Referring to FIG. 7, a photomask 220 in accordance with the present embodiment includes highly reflective material layer patterns 222 and light shielding layer patterns 223, which are disposed on a light transmitting substrate 221. Such a photomask 220 may be formed through an appropriate patterning process by using the blank mask 120 described herein with reference to FIG. 2, as an original processing target. The photomask 220 has light transmitting regions 225 and light shielding regions 226. The surface of the light transmitting substrate 221 is exposed in the light transmitting regions 225, and the highly reflective material layer patterns 222 and the light shielding layer patterns 223 are disposed on the light transmitting substrate 221 in the light shielding regions 226. The light transmitting substrate 221 may be formed of a light transmitting material, for example, quartz. While it is illustrated in the Figure that the light shielding regions 226, in which the highly reflective material layer patterns 222 and the light shielding layer patterns 223 are disposed, serve as regions where main patterns for transferring patterns to a wafer are disposed, the light shielding regions 226 may serve as other regions, for example, frame regions which surround regions where main patterns are to be disposed or scribe lines.

The highly reflective material layer patterns 222 may have a multi-layered structure in which first layer patterns 222*a* and second layer patterns 222*b* are alternately disposed. In an embodiment, the first layer patterns 222*a* and the second layer patterns 222*b* may be, respectively, molybdenum (Mo) layer patterns and silicon (Si) layer patterns. In another embodiment, the first layer patterns 222*a* and the second layer patterns 222*b* may be, respectively, ruthenium (Ru) layer patterns and silicon (Si) layer patterns, molybdenum (Mo) layer patterns and beryllium (Be) layer patterns, or silicon (Si) layer patterns and niobium (Nb) layer patterns. The highly reflective material layer patterns 222 may have a reflectivity of 20% to 90% with respect to light. The reflectivity of the highly reflective material layer patterns 222 may be appropriately controlled by regulating the thicknesses and the number of stacked highly reflective material layer patterns 222 that include the first layer patterns 222*a* and the second layer patterns 222*b*, which form the highly reflective material layer patterns 222. In an embodiment, the highly reflective material layer patterns 222 may have a thickness smaller than the thickness of the light shielding layer patterns 223. In another embodiment, the highly reflective material layer patterns 222 may have a thickness equal to or larger than the light shielding layer patterns 223. The light shielding layer patterns 223 may be formed of a light shielding material, for example, chrome (Cr) layer patterns.

In the photomask 220 in accordance with the present embodiment, light corresponding to 20% to 90% of incident light 228, which is transmitted through the light transmitting substrate 221 is reflected to the light transmitting substrate 221 by the highly reflective material layer patterns 222. Accordingly, an amount of light corresponding to 6% of the incident light 228 is transmitted through the light shielding layer patterns 223. And an amount of light corresponding to 4% to 74% of the incident light 228 is absorbed into the light shielding layer patterns 223. As shown in the Figure, in an embodiment where the highly reflective material layer patterns 222 have a reflectivity of 50% and the light shielding layer patterns 223 have a transmittance of 6%, light corresponding to 44% is absorbed into the light shielding layer patterns 223. Thus, when compared to the case where all the remaining quantity of light except small quantities of reflected light and transmitted light is absorbed into the light shielding layer patterns 223, a temperature rise of the light shielding layer patterns 223 may be suppressed during a photolithography process. In another embodiment, when a material with low thermal conductivity is used as the material of the highly reflective material layer patterns 222, it is possible to decrease a degree at which the heat generated by the absorption of a quantity of light by the light shielding layer patterns 223 is transferred to the light transmitting substrate 221.

Figure 8:
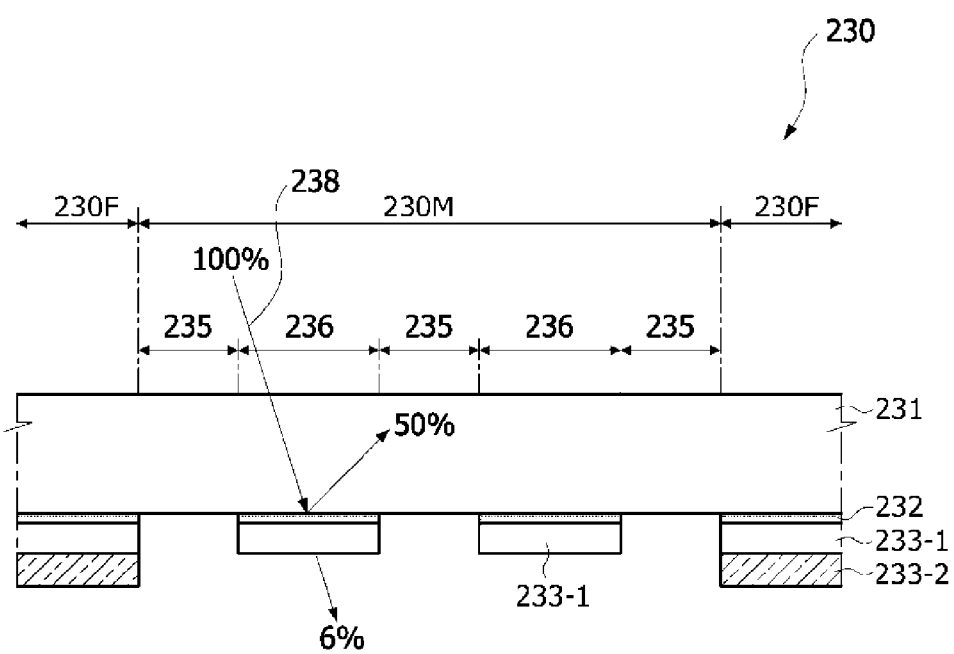
FIG. 8 is a cross-sectional view illustrating a photomask in accordance with an embodiment.

FIG. 8 is a cross-sectional view illustrating a photomask in accordance with an embodiment. Referring to FIG. 8, a photomask 230 in accordance with the present embodiment includes highly reflective material layer patterns 232 and phase shifting layer patterns 233-1, which are disposed on a light transmitting substrate 231. Such a photomask 230 may be formed through an appropriate patterning process by using the blank mask 130 described herein with reference to FIG. 3 as an original processing target. The photomask 230 has a main pattern area 230M and a frame area 230F. The main pattern area 230M is surrounded by the frame area 230F. The main pattern area 230M is an area where the phase shifting layer patterns 233-1, for transfer of patterns to a wafer, are disposed, and the frame area 230F is an area where light is shielded to suppress an overlapping phenomenon during a photolithography process. The main pattern area 230M has light transmitting regions 235 and phase shifting regions 236. The surface of the light transmitting substrate 231 is exposed in the light transmitting regions 235, and the highly reflective material layer patterns 232 and the phase shifting layer patterns 233-1 are disposed on the light transmitting substrate 231 in the phase shifting regions 236. In the frame area 230F, the highly reflective material layer patterns 232, the phase shifting layer patterns 233-1 and light shielding layer patterns 233-2 are disposed on the light transmitting substrate 231.

The light transmitting substrate 231 may be formed of a light transmitting material, for example, quartz. While not shown in the Figure, in an embodiment where a plurality of main pattern areas 230M are defined, the main pattern areas 230M may be divided by scribe lines. In the embodiment, at the scribe lines, as in the frame area 230F, the highly reflective material layer patterns 232, the phase shifting layer patterns 233-1 and the light shielding layer patterns 233-2 are disposed on the light transmitting substrate 231.

The highly reflective material layer patterns 232 may be formed of a material that includes at least any one of silicon (Si), molybdenum (Mo), tantalum (Ta), zirconium (Zr), aluminum (Al), titanium (Ti), platinum (Pt), ruthenium (Ru), chrome (Cr) and stannum (Sn). Also, the highly reflective material layer patterns 232 may additionally include any one constituent of oxygen (O) and nitrogen (N). Such highly reflective material layer patterns 232 may have a reflectivity of 20% to 90% with respect to light. The reflectivity of the highly reflective material layer patterns 232 may be appropriately controlled by regulating the composition ratio of materials that form the highly reflective material layer patterns 232. In an embodiment, the highly reflective material layer patterns 232 may have a thickness smaller than the thickness of the phase shifting layer patterns 233-1. In another embodiment, the highly reflective material layer patterns 232 may have a thickness equal to or larger than the phase shifting layer patterns 233-1. In an embodiment, the phase shifting layer patterns 233-1 may be formed of a phase shifting material, such as molybdenum-silicon (MoSi). In another embodiment, the phase shifting layer patterns 233-1 may be formed of a molybdenum silicon nitride (MoSiN) or a silicon oxide (SiO2). The stack structure of the highly reflective material layer patterns 232 and the phase shifting layer patterns 233-1 may have a transmittance equal to or less than 50%, for example, of approximately 6%, and a phase shifting degree of 150° to 250°. The light shielding layer patterns 233-2 may be formed of a light shielding material, such as chrome (Cr).

In the photomask 230 in accordance with the present embodiment, light corresponding to 20% to 90% of incident light 238, which is transmitted through the light transmitting substrate 231, is reflected to the light transmitting substrate 231 by the highly reflective material layer patterns 232. Also, a portion of light transmitted through the highly reflective material layer patterns 232 is reflected to the light transmitting substrate 231 by the phase shifting layer patterns 233-1. Accordingly, an amount of light corresponding to 6% of the incident light 238 is transmitted through the phase shifting layer patterns 233-1. And an amount of light corresponding to 4% to 74% of the incident light 238 is absorbed into the phase shifting layer patterns 233-1.

As shown in the Figure, in an embodiment where the highly reflective material layer patterns 232 have a reflectivity of 50% and the phase shifting layer patterns 233-1 have a transmittance of 6%, when neglecting the reflectivity of the phase shifting layer patterns 233-1, the phase shifting layer patterns 233-1 absorb light corresponding to 44%. Thus, when compared to the case where all the remaining quantity of light except small quantities of reflected light and transmitted light is absorbed into the phase shifting layer patterns 233-1, a temperature rise of the phase shifting layer patterns 233-1 may be suppressed during a photolithography process. In another embodiment, when a material with low thermal conductivity is used as the material of the highly reflective material layer patterns 232, it is possible to decrease a degree at which the heat generated by the absorption of a quantity of light by the phase shifting layer patterns 233-1 is transferred to the light transmitting substrate 231.

Figure 9:
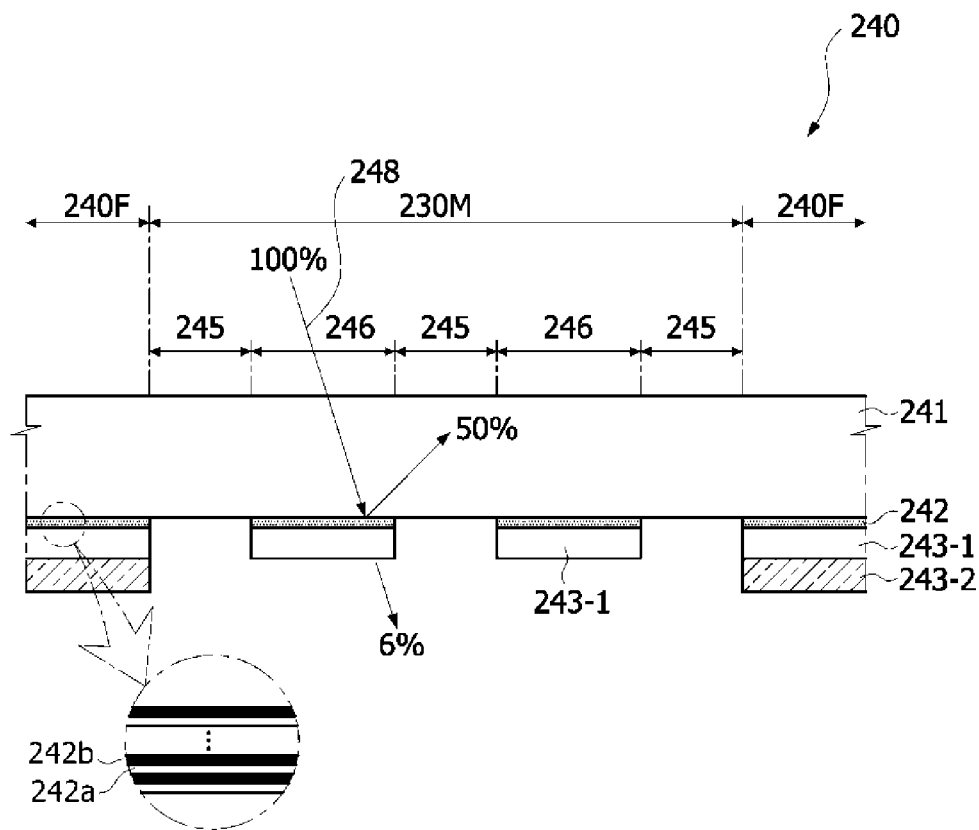
FIG. 9 is a cross-sectional view illustrating a photomask in accordance with an embodiment.

FIG. 9 is a cross-sectional view illustrating a photomask in accordance with an embodiment. Referring to FIG. 9, a photomask 240 in accordance with the present embodiment includes highly reflective material layer patterns 242 and phase shifting layer patterns 243-1, which are disposed on a light transmitting substrate 241. Such a photomask 240 may be formed through an appropriate patterning process by using the blank mask 140 described herein with reference to FIG. 4, as an original processing target. The photomask 240 has a main pattern area 240M and a frame area 240F. The main pattern area 240M is surrounded by the frame area 240F. The main pattern area 240M is an area where the phase shifting layer patterns 243-1, for transfer of patterns to a wafer, are disposed, and the frame area 240F is an area where light is shielded to suppress an overlapping phenomenon during a photolithography process. The main pattern area 240M has light transmitting regions 245 and phase shifting regions 246. The surface of the light transmitting substrate 241 is exposed in the light transmitting regions 245, and the highly reflective material layer patterns 242 and the phase shifting layer patterns 243-1 are disposed on the light transmitting substrate 241 in the phase shifting regions 246. In the frame area 240F, the highly reflective material layer patterns 242, the phase shifting layer patterns 243-1 and light shielding layer patterns 243-2 are disposed on the light transmitting substrate 241.

The light transmitting substrate 241 may be formed of a light transmitting material, for example, quartz. While not shown in the Figure, in an embodiment where a plurality of main pattern areas 240M are defined, the main pattern areas 240M may be divided by scribe lines. In the embodiment, at the scribe lines, as in the frame area 240F, the highly reflective material layer patterns 242, the phase shifting layer patterns 243-1 and the light shielding layer patterns 243-2 are disposed on the light transmitting substrate 241.

The highly reflective material layer patterns 242 may have a multi-layered structure in which first layer patterns 242a and second layer patterns 242b are alternately disposed. In an embodiment, the first layer patterns 242a and the second layer patterns 242b may be, respectively, molybdenum (Mo) layer patterns and silicon (Si) layer patterns. In another embodiment, the first layer patterns 242a and the second layer patterns 242b may be, respectively, ruthenium (Ru) layer patterns and silicon (Si) layer patterns, molybdenum (Mo) layer patterns and beryllium (Be) layer patterns, or silicon (Si) layer patterns and niobium (Nb) layer patterns. The highly reflective material layer patterns 242 may have a reflectivity of 20% to 90% with respect to light. The reflectivity of the highly reflective material layer patterns 242 may be appropriately controlled by regulating the thicknesses and the number of stacked highly reflective material layer patterns 222 that include the first layer patterns 242a and the second layer patterns 242b, which form the highly reflective material layer patterns 242. In an embodiment, the highly reflective material layer patterns 242 may have a thickness smaller than the thickness of the light shielding layer patterns 243-1. In another embodiment, the highly reflective material layer patterns 242 may have a thickness equal to or larger than the light shielding layer patterns 243-1.

In an embodiment, the phase shifting layer patterns 243-1 may be formed of a phase shifting material, such as molybdenum-silicon (MoSi). In another embodiment, the phase shifting layer patterns 243-1 may be formed of a molybdenum silicon nitride (MoSiN) or a silicon oxide (SiO2). The stack structure of the highly reflective material layer patterns 242 and the phase shifting layer patterns 243-1 may have a transmittance equal to or less than 50%, for example, of approximately 6%, and a phase shifting degree of 150° to 250°. The light shielding layer patterns 243-2 may be formed of a light shielding material such as chrome (Cr).

In the photomask 240 in accordance with the present embodiment, light corresponding to 20% to 90% of incident light 248, which is transmitted through the light transmitting substrate 241, is reflected to the light transmitting substrate 241 by the highly reflective material layer patterns 242. Also, a portion of light transmitted through the highly reflective material layer patterns 242 is reflected to the light transmitting substrate 241 by the phase shifting layer patterns 243-1. Accordingly, an amount of light corresponding to 6% of the incident light 248 is transmitted through the phase shifting layer patterns 243-1. And an amount of light corresponding to 4% to 74% of the incident light 248 is absorbed into the phase shifting layer patterns 243-1.

As shown in the Figure, in the case where the highly reflective material layer patterns 242 have a reflectivity of 50% and the phase shifting layer patterns 243-1 have a transmittance of 6%, when neglecting the reflectivity of the phase shifting layer patterns 243-1, the phase shifting layer patterns 243-1 absorb light corresponding to 44%. Thus, when compared to the case where all the remaining quantity of light except small quantities of reflected light and transmitted light is absorbed into the phase shifting layer patterns 243-1, a rise in temperature of the phase shifting layer patterns 243-1 may be suppressed during a photolithography process. In another embodiment, when a material with low thermal conductivity is used as the material of the highly reflective material layer patterns 242, it is possible to decrease a degree at which the heat generated by the absorption of a quantity of light by the phase shifting layer patterns 243-1 is transferred to the light transmitting substrate 241.

Figure 10:
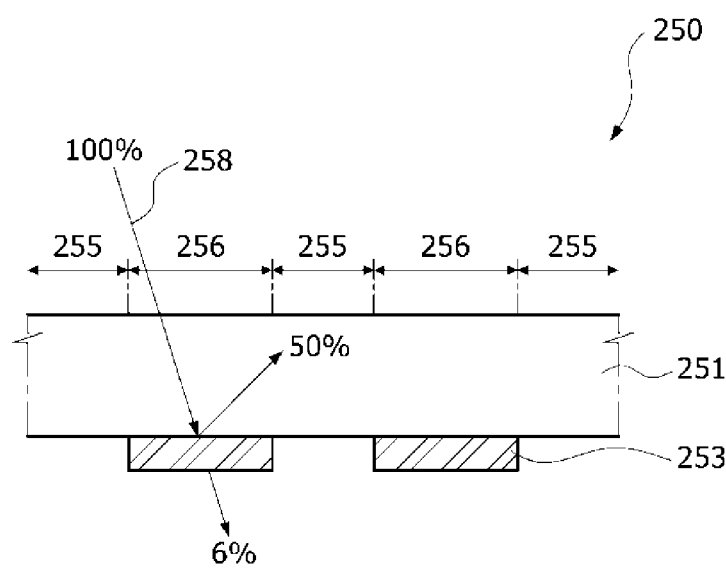
FIG. 10 is a cross-sectional view illustrating a photomask in accordance with an embodiment.

FIG. 10 is a cross-sectional view illustrating a photomask in accordance with an embodiment. Referring to FIG. 10, a photomask 250 in accordance with the present embodiment includes light shielding layer patterns 253, which are disposed on a light transmitting substrate 251. The light transmitting substrate 251 has light transmitting regions 255 and light shielding regions 256. The surface of the light transmitting substrate 251 is exposed in the light transmitting regions 255, and the light shielding layer patterns 253 are disposed on the light transmitting substrate 251 in the light shielding regions 256. The light shielding regions 256 may include scribe lines or frame regions other than main pattern regions where transfer patterns are disposed. In an embodiment, the light transmitting substrate 251 may be formed of quartz. In an embodiment, the light shielding layer patterns 253 may be formed of a light shielding material, such as chrome (Cr). In the photomask 250 in accordance with the present embodiment, the light shielding layer patterns 253 is formed of a material that may reflect at least 20% to 90% (for example, 50%) of incident light 258 and may transmit up to 10% (for example, 6%) of the incident light 258.

In an embodiment, a reflectivity regulating constituent such as oxygen (O) and nitrogen (N) may be added to a material, for example, chrome (Cr), which forms the light shielding layer patterns 253. As shown in the Figure, in an embodiment where the light shielding layer patterns 253 have a reflectivity of 50% and a transmittance of 6%, the quantity of light corresponding to 44% of the light 258 incident on the light shielding layer patterns 253 is absorbed into the light shielding layer patterns 253. Thus, when compared to the case where all the remaining quantity of light except small quantities of reflected light and transmitted light is absorbed into the light shielding layer patterns 253, a rise in temperature of the light shielding layer patterns 253 may be suppressed during a photolithography process. In another embodiment, when a material with low thermal conductivity is used as the material of the light shielding layer patterns 253, it is possible to decrease a degree at which the heat generated by the absorption of a quantity of light by the light shielding layer patterns 253 is transferred to the light transmitting substrate 251. Although a binary type photomask has been described as an example in the present embodiment, even in the case of a phase shifting type photomask, all features are similar except that phase shifting layer patterns are used instead of the light shielding layer patterns 253.

Figure 11:
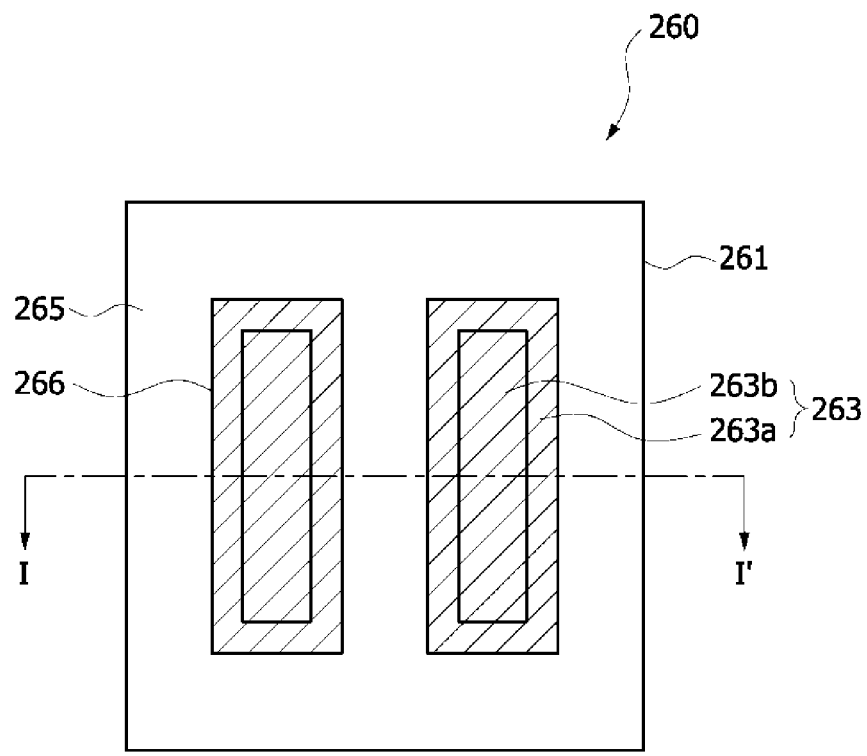
FIG. 11 is a plan view illustrating a photomask in accordance with an embodiment.
Figure 12:
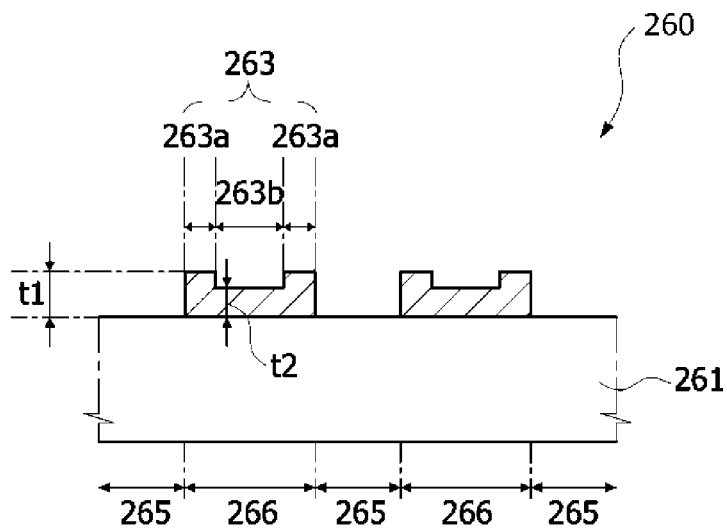
FIG. 12 is a cross-sectional view taken along the line I-I' of FIG. 11.

FIG. 11 is a plan view illustrating a photomask in accordance with an embodiment. FIG. 12 is a cross-sectional view taken along the line I-I' of FIG. 11. Referring to FIGS. 11 and 12, a photomask 260 in accordance with the present embodiment includes light shielding layer patterns 263, which are disposed on a light transmitting substrate 261. In an embodiment, the light transmitting substrate 261 may be formed of a light transmitting material, for example, quartz. The light transmitting substrate 261 may have light transmitting regions 265 and light shielding regions 266. The surface of the light transmitting substrate 261 may be exposed in the light transmitting regions 265. The light shielding layer patterns 263 may be disposed on the light transmitting substrate 261 in the light shielding regions 266. In an embodiment, the light shielding layer patterns 263 may be formed of a light shielding material, for example, chrome (Cr). The light shielding layer patterns 263 may include transfer patterns, which cause the transfer of light to a wafer through an exposure process, and scribe lines or light shielding layer patterns, which are disposed in a frame area. While the light shielding layer patterns 263 have a quadrangular shape in the present embodiment, other shapes or geometries, such as a circular hole shape, may be used as the shielding layer patterns 263.

The light shielding layer patterns 263 may be formed to include inside second light shielding layer patterns 263b and first light shielding layer patterns 263a, which surround the second light shielding layer patterns 263b. The first light shielding layer patterns 263a have a first thickness t1. The second light shielding layer patterns 263b have a second thickness t2 that is relatively thinner than the first thickness t1 of the first light shielding layer patterns 263a. The first thickness t1 of the first light shielding layer patterns 263a may be the thickness of a light shielding layer, which is provided in a blank mask. The second thickness t2 of the second light shielding layer patterns 263b may be a thickness that is decreased by a predetermined thickness from the thickness of the light shielding layer provided in the blank mask. In an embodiment, the second thickness t2 of the second light shielding layer patterns 263b may be approximately 50% to approximately 90% of the first thickness t1 of the first light shielding layer patterns 263a. The thickness of the light shielding layer patterns 263 may determine or affect the quantity of light transmitted through the light shielding layer patterns 263. Thus, a quantity of light transmitted through the light shielding layer patterns 263 may be small when the light shielding layer patterns 263 has a sufficient thickness, and may increase as the thickness of the light shielding layer patterns 263 is decreased.

Therefore, in the case where the second thickness t2 of the second light shielding layer patterns 263b is too thin, for example, in the case where the second thickness t2 of the second light shielding layer patterns 263b is smaller than 50% of the first thickness t1 of the first light shielding layer patterns 263a, a quantity of light transmitted through the second light shielding layer patterns 263b is increased, and thus the second light shielding layer patterns 263b may not be transferred to a wafer.

In an embodiment, the first thickness t1 of the first light shielding layer patterns 263a may be a thickness that allows a quantity of light transmitted through the first light shielding layer patterns 263a to be approximately 4% to approximately 40% of the incident light. Further, the second thickness t2 of the second light shielding layer patterns 263b may be a thickness that allows a quantity of light transmitted through the second light shielding layer patterns 263b to be approximately 7% to approximately 60% of the incident light.

Figure 13:
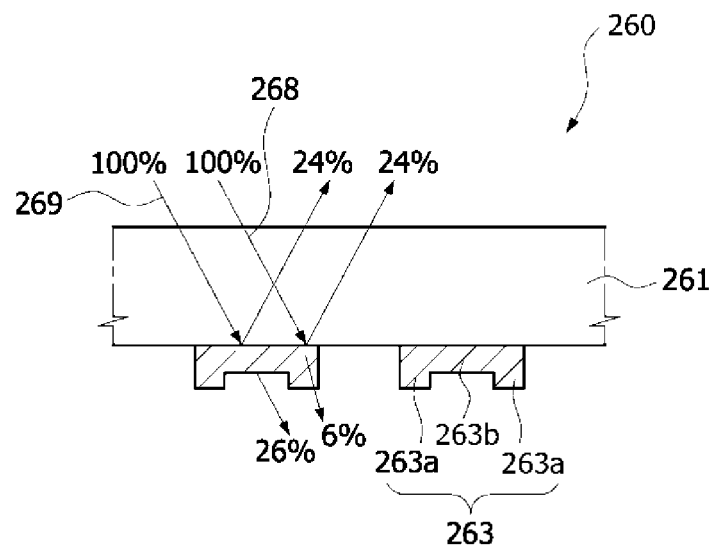
FIG. 13 is a view explaining light absorption quantities in the case where exposure is performed using the photomask of FIGS. 11 and 12.

FIG. 13 is a view explaining light absorption quantities in the case where exposure is performed using the photomask of FIGS. 11 and 12. In FIG. 13, the same reference numerals as in FIGS. 11 and 12 refer to the same elements. Referring to FIG. 13, since the first light shielding layer pattern 263a and the second light shielding layer pattern 263b are formed of the same material layer, a quantity of light reflected from the first light shielding layer pattern 263a in light 268 irradiated to the first light shielding layer pattern 263a through the light transmitting substrate 261 and a quantity of light reflected from the second light shielding layer pattern 263b in light 269 irradiated to the second light shielding layer pattern 263b through the light transmitting substrate 261 are substantially the same. In an embodiment, as shown in the Figure, a quantity of light reflected from the first light shielding layer pattern 263a in the light 268 irradiated to the first light shielding layer pattern 263a through the light transmitting substrate 261 and a quantity of light reflected from the second light shielding layer pattern 263b in the light 269 irradiated to the second light shielding layer pattern 263b through the light transmitting substrate 261 may be approximately 24%. Conversely, since the first light shielding layer pattern 263a and the second light shielding layer pattern 263b have difference thicknesses, quantities of light transmitted through the first light shielding layer pattern 263a and the second light shielding layer pattern 263b may be different from each other.

For example, the quantity of light corresponding to approximately 6% of the light 268 irradiated to the first light shielding layer pattern 263a through the light transmitting substrate 261 is transmitted through the first light shielding layer pattern 263a, and accordingly, a quantity of light absorbed into the first light shielding layer pattern 263a is approximately 70% of the irradiated light 268. The quantity of light corresponding to approximately 26% of the light 269 irradiated to the second light shielding layer pattern 263b through the light transmitting substrate 261 is transmitted through the second light shielding layer pattern 263b, and accordingly, a quantity of light absorbed into the second light shielding layer pattern 263b is approximately 50% of the irradiated light 269. Thus, a light absorption quantity in the second light shielding layer pattern 263b, which has the second thickness t2 that is relatively thinner, is decreased. Thus, an amount of heat generated due to absorption of irradiated light in the entire light shielding layer patterns 263 may be decreased. Such light absorption quantity distribution during an exposure process may be applied the same to the case of a phase shifting mask to which phase shifting layer patterns are applied instead of the light shielding layer patterns 263.

Figure 14:
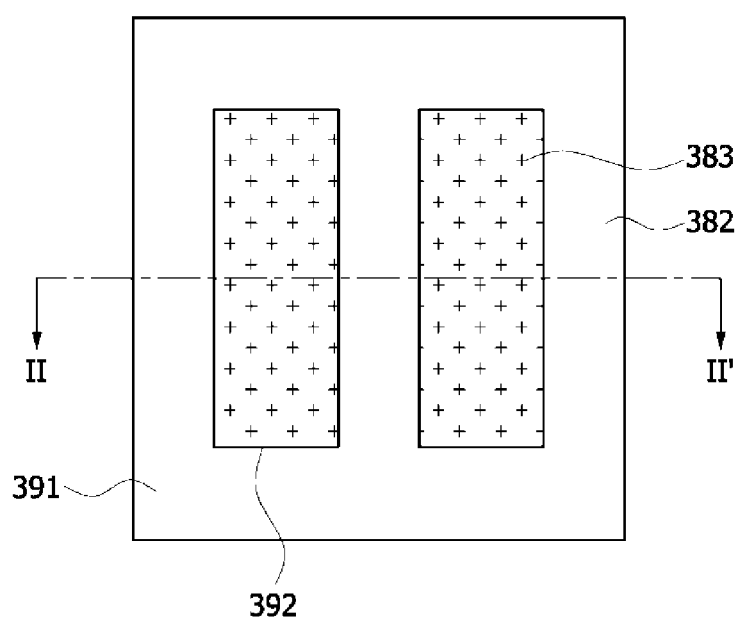
FIG. 14 is a plan view illustrating photoresist layer patterns which are formed by performing a photolithography process using the photomask of FIGS. 11 and 12.
Figure 15:
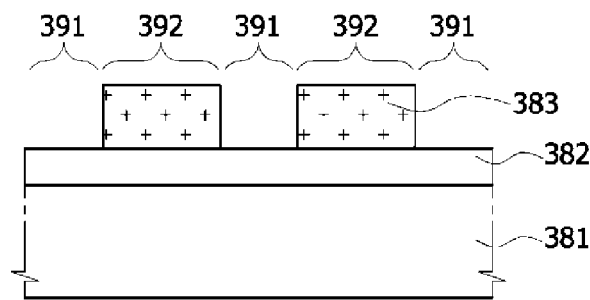
FIG. 15 is a cross-sectional view taken along the line II-II' of FIG. 14.

FIG. 14 is a plan view illustrating photoresist layer patterns, which are formed by performing a photolithography process using the photomask of FIGS. 11 and 12. FIG. 15 is a cross-sectional view taken along the line II-II' of FIG. 14. Referring to FIGS. 14 and 15 together with FIGS. 11 and 12, a photolithography process is performed for a photoresist layer, which is formed on a target patterning layer 382 formed on a substrate 381, by using the photomask 260 of FIGS. 11 and 12. In the case where the photoresist layer is a positive type, the photoresist layer is removed by development in regions 391 where light transmitted through the light transmitting regions 265 is irradiated, and photoresist layer patterns 383 are formed as the photoresist layer is not removed by development but is left in regions 392 corresponding to the light shielding layer patterns 263 of the light shielding regions 266. In other words, the photoresist layer patterns 383 are patterns that are formed as the first light shielding layer patterns 263a and the second light shielding layer patterns 263b are transferred. Therefore, even though the light shielding layer patterns 263 are formed by the first light shielding layer patterns 263a and the second light shielding layer patterns 263b, which have different thicknesses, no influence is exerted on transferring the light shielding layer patterns 263 to the photoresist layer patterns 383 which are formed on the substrate 381. Therefore, by using a photomask in accordance with another embodiment, the photoresist layer patterns 383 transferred with light shielding layer patterns may be formed as described herein with reference to FIGS. 14 and 15.

Figure 16:
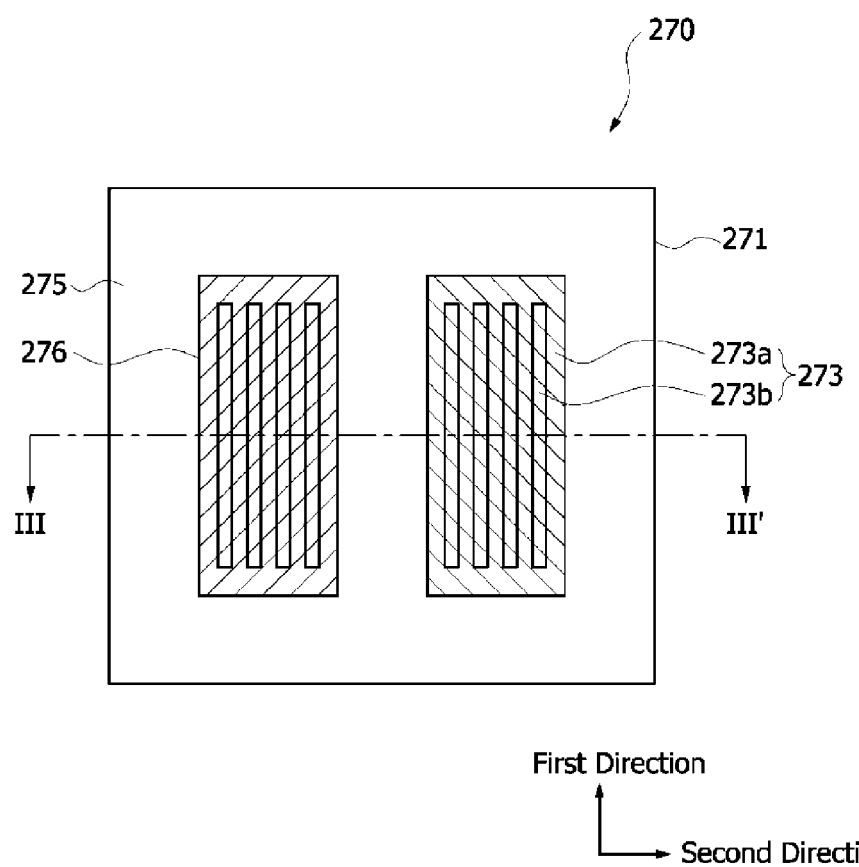
FIG. 16 is a plan view illustrating a photomask in accordance with an embodiment.
Figure 17:
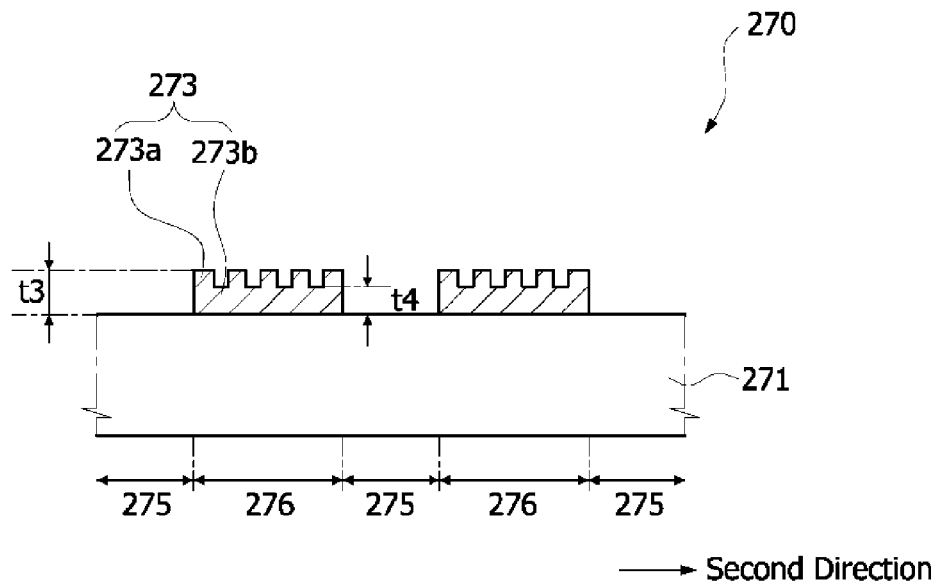
FIG. 17 is a cross-sectional view taken along the line III-III' of FIG. 16.

FIG. 16 is a plan view illustrating a photomask in accordance with an embodiment. FIG. 17 is a cross-sectional view taken along the line III-III' of FIG. 16. Referring to FIGS. 16 and 17, a photomask 270 in accordance with the present embodiment includes light shielding layer patterns 273, which are disposed on a light transmitting substrate 271. In an embodiment, the light transmitting substrate 271 may be formed of a light transmitting material, for example, quartz. The photomask 270 may have light transmitting regions 275 and light shielding regions 276. The surface of the light transmitting substrate 271 may be exposed in the light transmitting regions 275. The light shielding layer patterns 273 may be disposed on the light transmitting substrate 271 in the light shielding regions 276. In an embodiment, the light shielding layer patterns 273 may be formed of a light shielding material, for example, chrome (Cr). In another embodiment, phase shifting layer patterns may be used instead of the light shielding layer patterns 273. The phase shifting layer patterns may be formed of a phase shifting material, for example, molybdenum-silicon (MoSi), a molybdenum silicon nitride (MoSiN) or a silicon oxide ($SiO_2$).

In the embodiment, the light shielding regions 276 become phase shifting regions. While the light shielding layer patterns 273 have a quadrangular shape in the present embodiment, other shapes or geometries, such as a circular hole shape, may be used as the light shielding layer patterns 273.

The light shielding layer patterns 273 may be formed to include first light shielding layer patterns 273a, which have a first thickness t3 and second light shielding layer patterns 273b, which have a second thickness t4 smaller than the first thickness t3. The first light shielding layer patterns 273a and the second light shielding layer patterns 273b are formed of the same material layer. A plurality of second light shielding layer patterns 273b may be disposed in each light shielding region 276. The respective second light shielding layer patterns 273b in each light shielding region 276 may have stripe shapes which extend lengthwise in one direction, for example, a first direction. The respective second light shielding layer patterns 273b in each light shielding region 276 may be disposed to be separated from one another by a predetermined gap in a second direction substantially perpendicular to the first direction.

In each light shielding region 276, the first light shielding layer pattern 273a is disposed to surround the respective second light shielding layer patterns 273b. Thus, the first light shielding layer pattern 273a is disposed on both ends of the second light shielding layer patterns 273b in the first direction. In the second direction and in each light shielding region 276, the first light shielding layer pattern 273a and the second light shielding layer patterns 273b are alternately disposed, but the first light shielding layer pattern 273a is disposed at both ends. According to such a configuration of the light shielding layer patterns 273, the first light shielding layer patterns 273a of the first thickness t3 that is relatively thicker may be disposed at all ends of the light shielding layer patterns 273, which adjoin the light transmitting regions 275, and it is possible to sufficiently secure the difference in the quantities of light transmitted and shielded at the boundaries between the light transmitting regions 275 and the light shielding regions 276.

The first thickness t3 of the first light shielding layer patterns 273a may be the thickness of a light shielding layer that is provided in a blank mask. The second thickness t4 of the second light shielding layer patterns 273b may be a thickness that is decreased by a predetermined thickness from the thickness of the light shielding layer provided in the blank mask. In an embodiment, the second thickness t4 of the second light shielding layer patterns 273b may be approximately 50% to approximately 90% of the first thickness t3 of the first light shielding layer patterns 273a. In the case where the second thickness t4 of the second light shielding layer patterns 273b is too thin, for example, in the case where the second thickness t4 of the second light shielding layer patterns 273b is smaller than 50% of the first thickness t3 of the first light shielding layer patterns 273a, a quantity of light which is transmitted through the second light shielding layer patterns 273b is increased, and thus the second light shielding layer patterns 273b may not be transferred to a wafer. In an embodiment, the first thickness t3 of the first light shielding layer patterns 273a may be a thickness that allows the transmittance of light transmitted through the first light shielding layer patterns 273a to be approximately 4% to approximately 40% of incident light. Further, the second thickness t4 of the second light shielding layer patterns 273b may be a thickness that allows the transmittance of light transmitted through the second light shielding layer patterns 273b to be approximately 7% to approximately 60% of the incident light.

Figure 18:
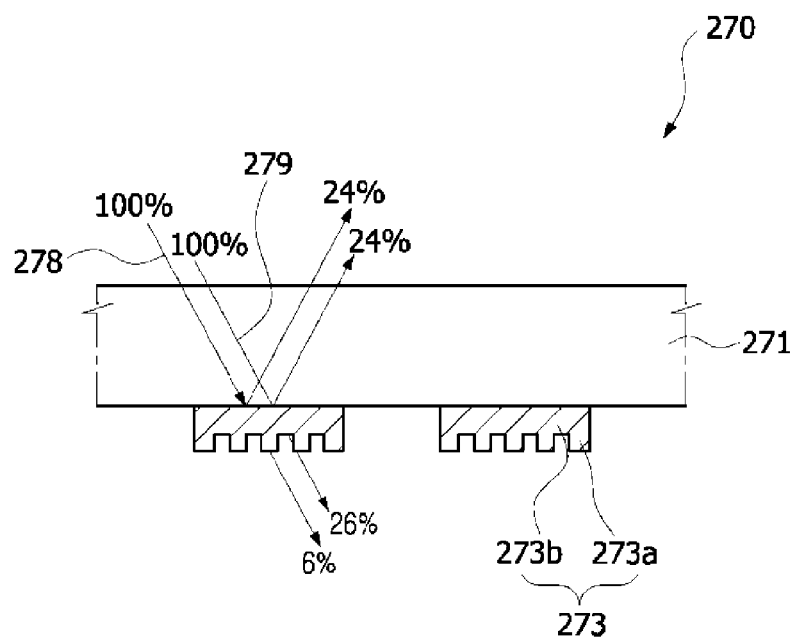
FIG. 18 is a view explaining light absorption quantities in the case where exposure is performed using the photomask of FIGS. 16 and 17.

FIG. 18 is a view explaining light absorption quantities in the case where exposure is performed using the photomask of FIGS. 16 and 17. In FIG. 18, the same reference numerals as in FIGS. 16 and 17 refer to the same elements. Referring to FIG. 18, since the first light shielding layer pattern 273a and the second light shielding layer pattern 273b are formed of the same material layer, a quantity of light reflected from the first light shielding layer pattern 273a in light 278 irradiated to the first light shielding layer pattern 273a through the light transmitting substrate 271 and a quantity of light reflected from the second light shielding layer pattern 273b in light 279 irradiated to the second light shielding layer pattern 273b through the light transmitting substrate 271 are substantially the same with each other. Thus, both a quantity of light reflected from the first light shielding layer pattern 273a in the light 278 irradiated to the first light shielding layer pattern 273a through the light transmitting substrate 271 and a quantity of light reflected from the second light shielding layer pattern 273b in the light 279 irradiated to the second light shielding layer pattern 273b through the light transmitting substrate 271 may be approximately 24%.

Conversely, since the first light shielding layer pattern 273a and the second light shielding layer pattern 273b have difference thicknesses, quantities of light transmitted through the first light shielding layer pattern 273a and the second light shielding layer pattern 273b may be different from each other. For example, the quantity of light corresponding to approximately 6% of the light 278 irradiated to the first light shielding layer pattern 273a through the light transmitting substrate 271 is transmitted through the first light shielding layer pattern 273a, and accordingly, a quantity of light absorbed into the first light shielding layer pattern 273a is approximately 70% of the irradiated light 278. Conversely, the quantity of light corresponding to approximately 26% of the light 279 irradiated to the second light shielding layer pattern 273b through the light transmitting substrate 271 is transmitted through the second light shielding layer pattern 273b, and accordingly, a quantity of light absorbed into the second light shielding layer pattern 273b is approximately 50% of the irradiated light 279. Thus, a light absorption quantity in the second light shielding layer pattern 273b, which has the second thickness t4 that is relatively thinner, is decreased, and an amount of heat generated due to absorption of irradiated light in the light shielding layer patterns 273 may be decreased.

Figure 19:
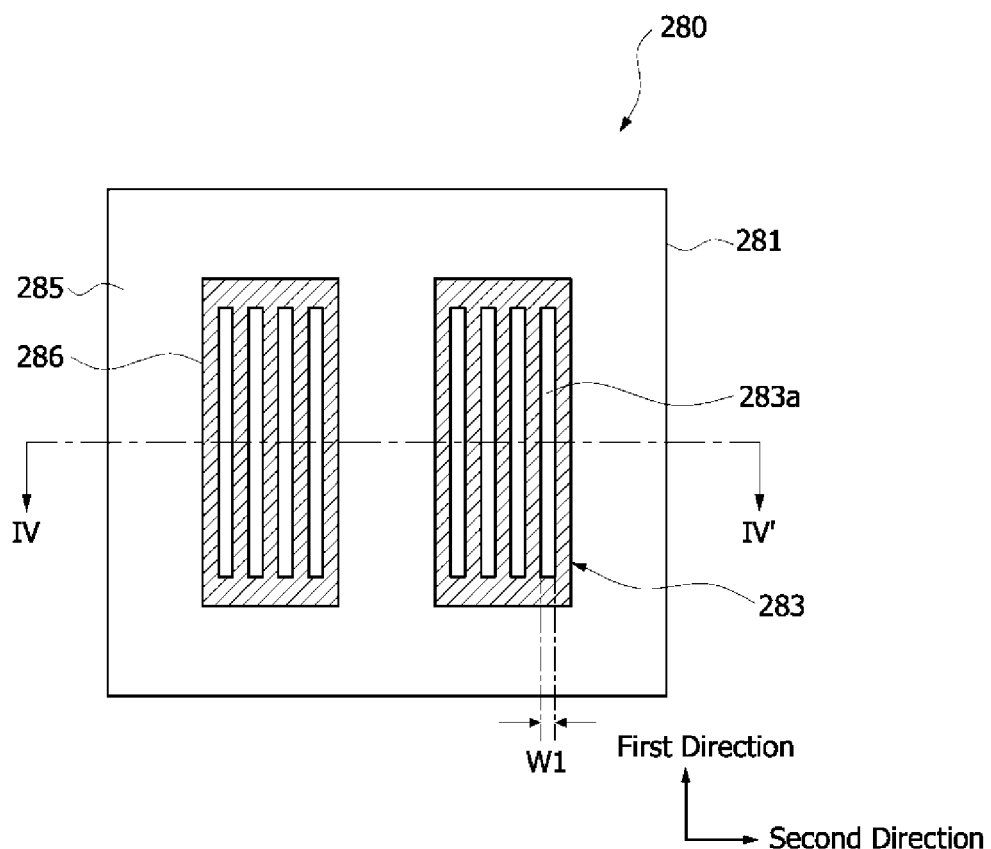
FIG. 19 is a plan view illustrating a photomask in accordance with an embodiment.
Figure 20:
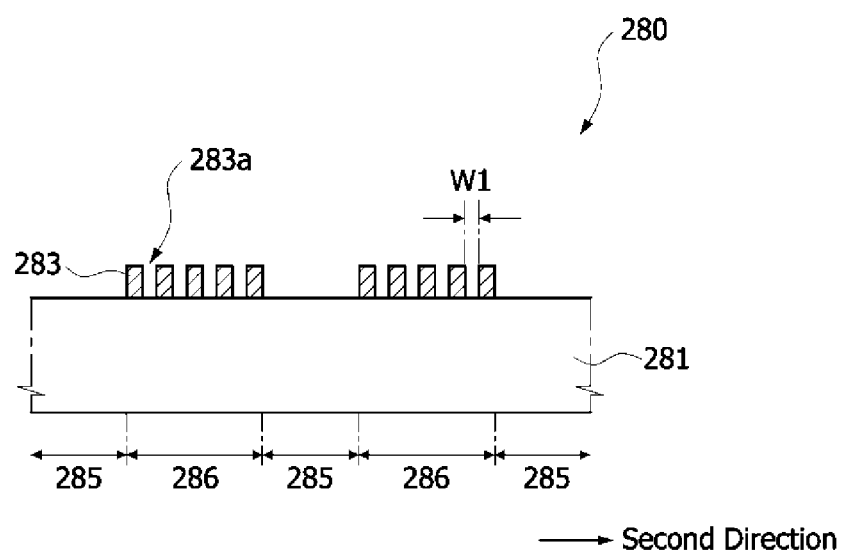
FIG. 20 is a cross-sectional view taken along the line IV-IV' of FIG. 19.

FIG. 19 is a plan view illustrating a photomask in accordance with an embodiment. FIG. 20 is a cross-sectional view taken along the line IV-IV' of FIG. 19. Referring to FIGS. 19 and 20, a photomask 280 in accordance with the present embodiment includes light shielding layer patterns 283, which are disposed on a light transmitting substrate 281. In an embodiment, the light transmitting substrate 281 may be formed of a light transmitting material, for example, quartz. The photomask 280 may have light transmitting regions 285 and light shielding regions 286. The surface of the light transmitting substrate 281 may be exposed in the light transmitting regions 285. The light shielding layer patterns 283 may be disposed on the light transmitting substrate 281 in the light shielding regions 286. In an embodiment, the light shielding layer patterns 283 may be formed of a light shielding material, for example, chrome (Cr). In another embodiment, phase shifting layer patterns which may be formed of a phase shifting material, for example, molybdenum-silicon (MoSi), may be used instead of the light shielding layer patterns 283. In this case, the light shielding regions 286 become phase shifting regions. While the light shielding layer patterns 283 have a quadrangular shape in the present embodiment, other shapes or geometries, such as a circular hole shape, may be used for the light shielding layer patterns 283.

Each of the light shielding layer patterns 283 may have therein a plurality of trench segments 283a, which expose the light transmitting substrate 281. The respective trench segments 283a in each light shielding layer pattern 283 may have stripe shapes that extend lengthwise in a first direction, and may be disposed to be separated from one another by a predetermined gap in a second direction substantially perpendicular to the first direction. Thus, the light shielding layer pattern 283 and the trench segments 283a are alternately disposed in the second direction.

A width W1 of the trench segment 283a is a width of a degree for the trench segment 283a itself not to be transferred to a wafer in a photolithography process, even though the surface of the light transmitting substrate 281 is exposed by the trench segment 283a. The width W1 of the trench segment 283a of such a condition may be determined according to the size and thickness of the light shielding layer pattern 283, the wavelength of light used, an illumination system used in a photolithography apparatus, and so forth. As the trench segment 283a itself is not transferred to a wafer in a photolithography process in this way, the pattern of the entire shape of the light shielding layer pattern 283 including the trench segments 283a may be transferred to a wafer.

In the photomask 280 in accordance with the present embodiment, the heat generated by the light energy absorbed by the light shielding layer pattern 283 may be dissipated from the surfaces of the light shielding layer pattern 283 which are exposed due to the presence of the trench segments 283a, and accordingly, a rise in temperature due to light energy absorption by the light shielding layer pattern 283 in a photolithography process may be suppressed. Moreover, because the contact area between the light shielding layer pattern 283 and the light transmitting substrate 281 is decreased by the areas of the trench segments 283a, a phenomenon that the heat generated by the light shielding layer pattern 283 is transferred to the light transmitting substrate 281 may be suppressed. Further, since the trench segments 283a induce refraction of light that is transmitted through the trench segments 283a, within the range of not exerting an influence on patterning, light to be transmitted through an adjacent light shielding layer pattern 283 may be offset.

While various embodiments have been described above, it will be understood to those skilled in the art that the embodiments described are by way of example only. Accordingly, the blank mask and the photomask for suppressing heat absorption described herein should not be limited based on the described embodiments.

What is claimed is:

1. A photomask blank, comprising:
   a light transmitting substrate;
   a highly reflective material layer disposed over the light transmitting substrate; and
   a light shielding layer disposed over the highly reflective material layer.

2. The photomask blank according to claim 1, wherein the highly reflective material layer includes silicon (Si), molybdenum (Mo), tantalum (Ta), zirconium (Zr), aluminum (Al), titanium (Ti), platinum (Pt), ruthenium (Ru), chrome (Cr), stannum (Sn), or a combination thereof.

3. The photomask blank according to claim 2, wherein the highly reflective material layer includes oxygen (O), nitrogen (N), or both.

4. The photomask blank according to claim 1, wherein the highly reflective material layer has a multi-layered structure.

5. The photomask blank according to claim 4, wherein the multi-layered structure comprises a structure in which a molybdenum (Mo) layer and a silicon (Si) layer are alternately disposed.

6. The photomask blank according to claim 1, wherein the highly reflective material layer has a reflectivity of 20% to 90%.

7. The photomask blank according to claim 1, wherein the highly reflective material layer has a thickness that is less than a thickness of the light shielding layer.

8. The photomask blank according to claim 1, wherein the light shielding layer comprises a chrome (Cr) layer.

9. The photomask blank according to claim 1, further comprising:
   a phase shifting layer disposed between the highly reflective material layer and the light shielding layer.

10. The photomask blank according to claim 9, wherein the highly reflective material layer and the phase shifting layer have a transmittance equal to or less than 50% and a phase shifting degree of 150° to 250°.

11. The photomask blank according to claim 1, further comprising:
    a photoresist layer disposed over the light shielding layer.

12. A photomask comprising:
    a light transmitting substrate; and
    a light shielding layer pattern disposed over the light transmitting substrate that is to be transferred to a wafer during a photolithography process, the light shielding layer including:
    a thick light shielding layer pattern; and
    a thin light shielding layer pattern,
    wherein the thick light shielding layer pattern surrounds the thin light shielding layer pattern.

13. The photomask according to claim 12, wherein the light transmitting substrate has a light transmitting region in which the light transmitting substrate is exposed and a light shielding region in which the light shielding layer pattern is disposed.

14. The photomask according to claim 13, wherein the thin light shielding layer pattern is disposed in the light shielding region, and the thick light shielding layer pattern is disposed to surround the thin light shielding layer pattern at peripheries of the light shielding region.

15. The photomask according to claim 13, wherein the thin light shielding layer pattern is disposed in the light shielding region to be lengthwise in one direction.

16. The photomask according to claim 15, wherein the thin light shielding layer pattern comprises a plurality of thin light shielding layer patterns that are disposed to be separated from one another in a second, different direction.

17. The photomask according to claim 16, wherein the thick light shielding layer pattern is disposed at edges along peripheries of the light shielding layer pattern.

18. The photomask according to claim 12, wherein a thickness of the thin light shielding layer pattern is 50% to 90% of a thickness of the thick light shielding layer pattern.

19. The photomask according to claim 12, wherein the thick light shielding layer pattern has a thickness that allows approximately 4% to approximately 40% of light irradiated to the thick light shielding layer pattern to be transmitted, and the thin light shielding layer pattern has a thickness that allows approximately 7% to approximately 60% of light irradiated to the thin light shielding layer pattern to be transmitted.

20. The photomask according to claim 12, wherein the thick light shielding layer pattern and the thin light shielding layer pattern have the same reflectivity.

21. A photomask comprising:
    a light transmitting substrate; and
    a light shielding layer pattern disposed on the light transmitting substrate that is to be transferred to a wafer during a photolithography process, the light shielding layer pattern having therein trench segments which expose the light transmitting substrate.

22. The photomask according to claim 21, wherein the trench segments are defined to be lengthwise in a first direction and be separated from one another in a second direction that is substantially perpendicular to the first direction.

23. The photomask according to claim 22, wherein a width of the trench segments in the second direction is a width of a degree for the trench segment not to be transferred to the wafer in the photolithography process.

* * * * *